United States Patent [19]

Nakano et al.

[11] Patent Number: 5,831,928
[45] Date of Patent: *Nov. 3, 1998

[54] SEMICONDUCTOR MEMORY DEVICE INCLUDING A PLURALITY OF DYNAMIC MEMORY CELLS CONNECTED IN SERIES

[75] Inventors: Hiroaki Nakano, Kawasaki; Takehiro Hasegawa; Yukihito Oowaki, both of Yokohama, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 744,455

[22] Filed: Nov. 7, 1996

[30] Foreign Application Priority Data

Nov. 14, 1995 [JP] Japan .................................... 7-295584

[51] Int. Cl.$^6$ ...................................................... G11C 8/00
[52] U.S. Cl. ............................................ 365/233; 365/63
[58] Field of Search .............................. 365/233, 230.03, 365/63, 230.06

[56] References Cited

U.S. PATENT DOCUMENTS 5,293,348  3/1994  Abe ..................................... 365/230.03
5,341,341  8/1994  Fukuzo .................................... 365/233
5,392,242  2/1995  Koike .................................. 365/230.08

OTHER PUBLICATIONS

Y. Watanabe, et al. "A 286mm$^2$ 256Mb DRAM with X32 Both–Ends DQ", 1995 Symposium on VLSI Circuits Digest of Technical Papers, (pp. 105–106), Jun. 1995.

*Primary Examiner*—A. Zarabian
*Attorney, Agent, or Firm*—Oblon, Spivak, McClelland, Maier & Neustadt, P.C.

[57] ABSTRACT

A semiconductor device includes a memory cell array having memory cells arranged in a matrix form, a plurality of bit lines for communicating information to the memory cells, and a plurality of word lines crossing the bit lines to select among the memory cells, a plurality of sense amplifiers for amplifying data read out onto the bit lines, a plurality of data lines for transferring data amplified by the sense amplifiers to the outside of the cell array, the plurality of data lines including first and second wiring layers, a plurality of column select circuits for controlling connections of the plurality of data lines and the plurality of sense amplifiers, and a plurality of control signal lines connected to the plurality of column select circuits, the plurality of control lines including third and fourth wiring layers.

20 Claims, 10 Drawing Sheets

SEMICONDUCTOR MEMORY DEVICE INCLUDING A PLURALITY OF DYNAMIC MEMORY CELLS CONNECTED IN SERIES

BACKGROUND OF THE INVENTION

1. Field of the Invention

The invention relates to a semiconductor memory device and more specifically to an ultra high-density dynamic semiconductor memory device (DRAM) composed of memory cell units each comprising a plurality of dynamic memory cells connected in series.

2. Description of the Related Art

Recent improvements in memory cell structures and advances in fine processing techniques and circuit design techniques have significantly increased the packing densities of dynamic random access memories (DRAMs) using memory cells of the one-transistor/one-capacitor type. This progress will continue. The high packing densities of DRAMs have also resulted in an increase in the number of data bits that can be written or read at the same time.

Figure 1:
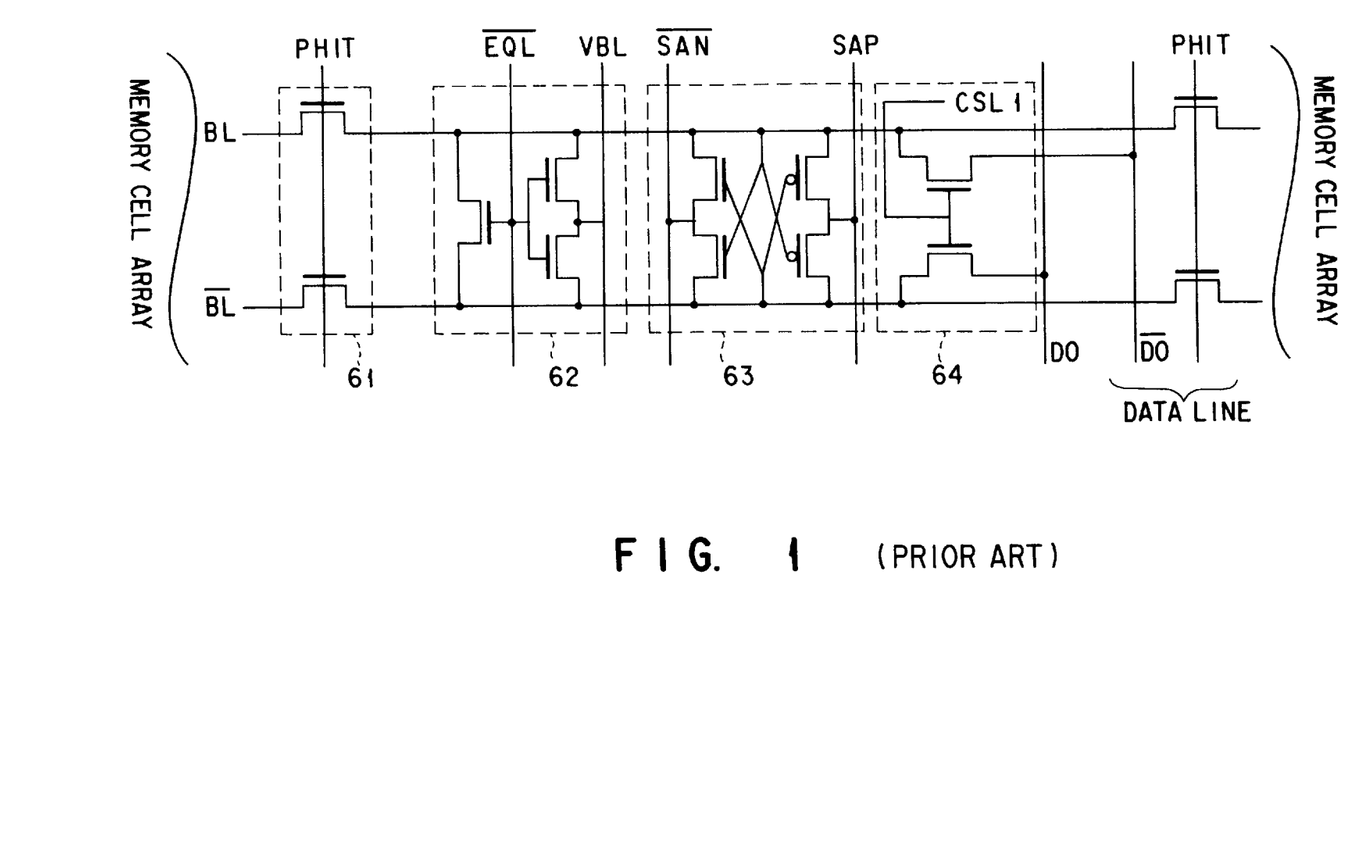
FIG. 1 shows a typical example of a conventional cell array control circuit.

A problem encountered in increasing the number of bits is how to take data out of memory cell arrays. FIG. 1 shows a typical example of a cell array control circuit placed in a cell array. The cell array control circuit is constructed from a cell array select circuit 61, an equalizer circuit 62 for equalizing the potential of a bit line BL to the desired one, a sense amplifier 63 for sensing and amplifying data read from a memory cell onto the bit line BL, and a column select circuit 64 connecting to a data line DQ for transferring the memory cell data on the bit line BL to outside of the memory cell array.

Figure 2:
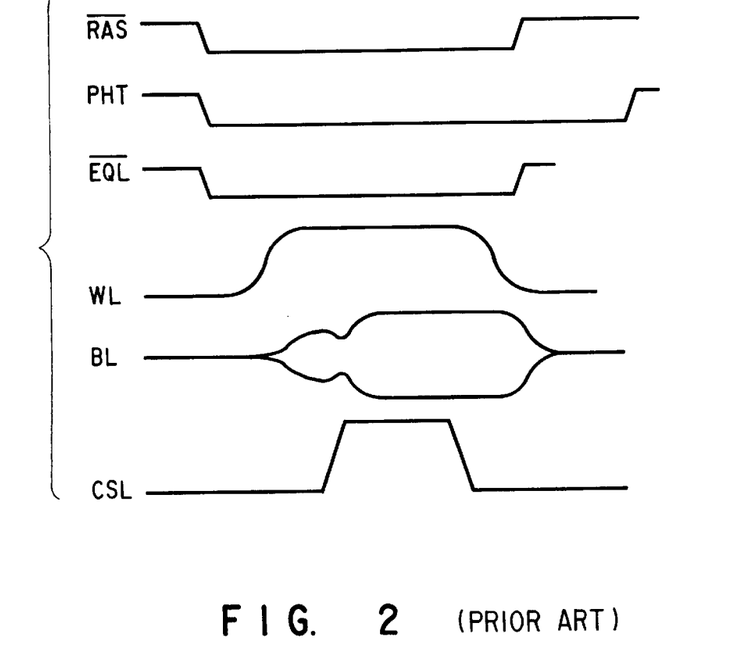
FIG. 2 shows an example of a timing chart for the operation of the conventional DRAM.

FIG. 2 is a timing chart explanatory of the operation of the cell array control circuit of FIG. 1. The operation of the cell array control circuit will be described briefly with reference to FIG. 2. When the signal /RAS is lowered and the DRAM becomes active, a cell array select transistor for a selected cell array is turned ON and cell array select transistors for non-selected cell arrays are turned OFF. The equalizer circuit which has held the bit line BL at the desired potential is turned OFF when the signal /EQL goes low, causing the bit line BL to become floating.

The word line WL next goes high, so that the selected memory cell data is read out onto the bit line BL, then amplified by the sense amplifier. When a potential difference of some magnitude is developed between the complementary bit lines, the bit line BL selected by the signal CSL at a high level is connected to the data line DQ so as to transfer the data on the selected column to the outside of the cell array. After the data has been transferred, the word line WL is caused to go low to thereby write data into the memory cell and the /EQL is caused to go high to thereby equalize the bit line BL. Thus, the DRAM is in the standby state.

Figure 3:
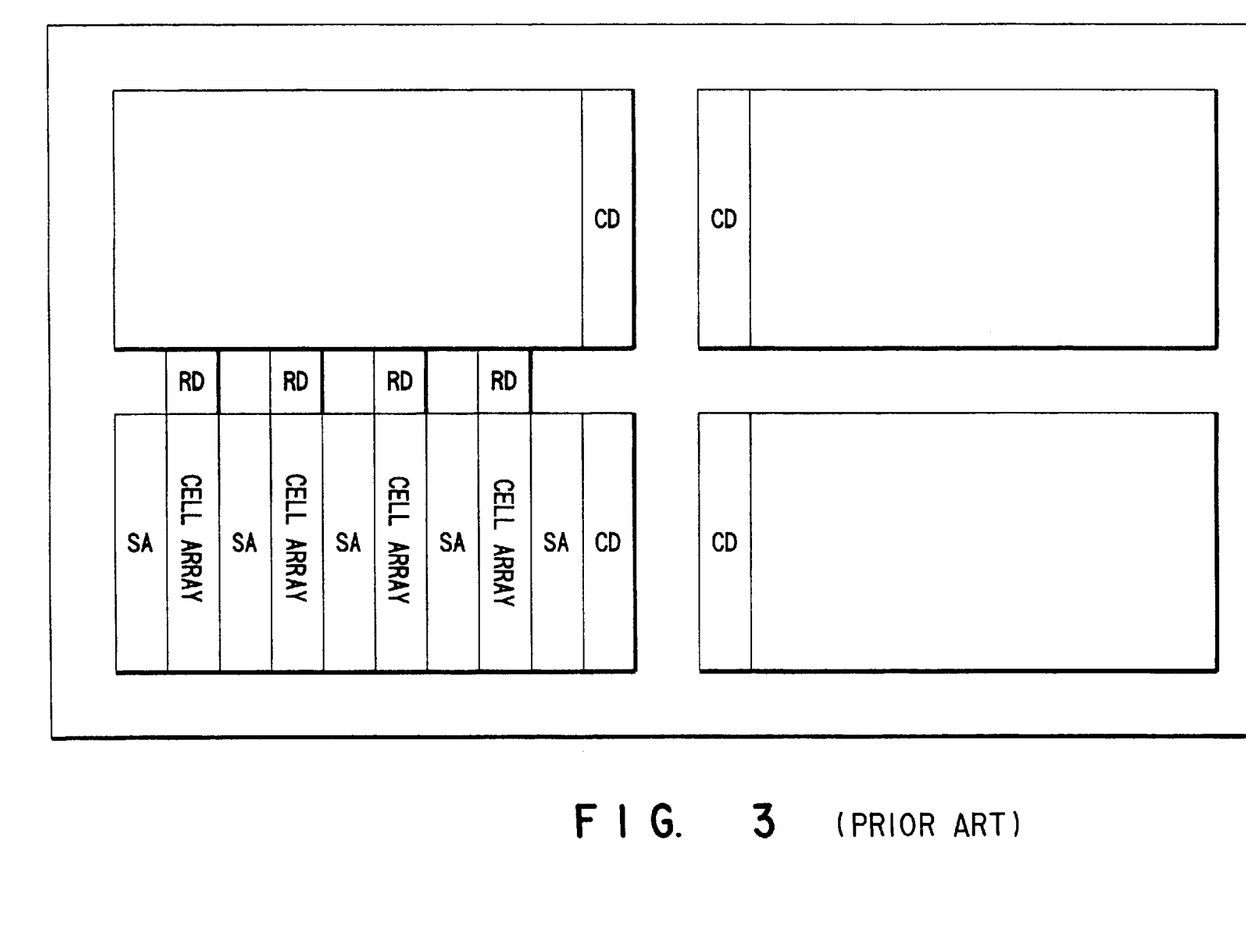
FIG. 3 shows an example of an arrangement of the conventional DRAM.

FIG. 3 shows an example of an arrangement of a DRAM. In the example of FIG. 3, the DRAM is constructed from row decoders RD that select among and control the word lines, column decoders CD that select among and control the CSL lines for selecting among column select circuits, cell array control circuits SA, and memory cell arrays. To reduce power dissipation and noise, each of the cell arrays is divided into multiple blocks. In operation, some of the blocks are activated. When only one cell array circuit is activated, therefore, the number of data items that can be read or written at the same time corresponds to the number of data lines that the cell array circuit has.

Increasing the number of bits could be attained by increasing the number of cell arrays that are activated simultaneously or increasing the number of data lines of the cell array control circuit. However, increasing the number of cell arrays that are activated simultaneously would result in increases in noise and power dissipation. On the other hand, increasing the number of data lines in the cell array control circuit would result in an increase in the chip area.

Next, the high-speed operation in columns will be described. As described previously, the operation of a DRAM comprises processes of reading, amplifying and rewriting of data, equalizing of bit lines, and so on. The required cycle time of the DRAM will thus be considerably long as compared with that of SRAMs. However, if the word line is first raised and then the sense amplifier is allowed to latch data, data can be read or written fast and successively by suitably controlling the CSL line.

Figure 4:
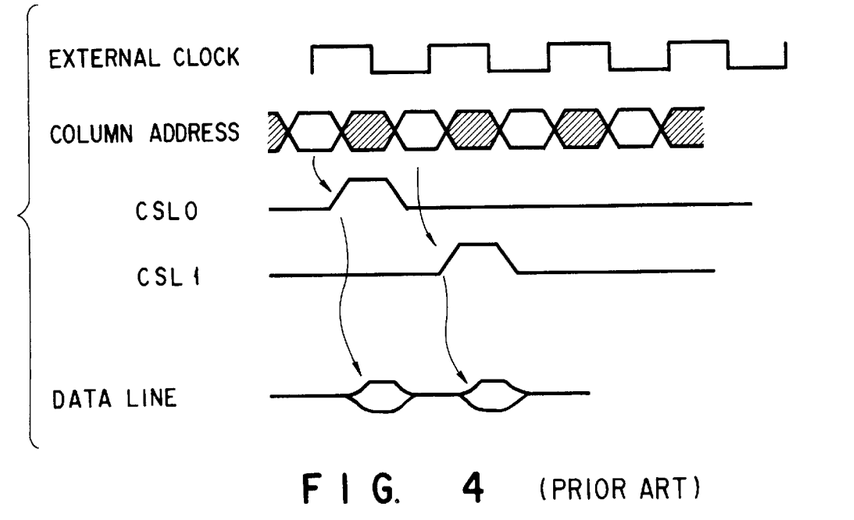
FIG. 4 is a timing chart for successive data read/write operation locked with an external clock in the conventional DRAM.

FIG. 4 is a timing chart of the operation of reading out data with the column address being changed synchronously with an external clock. In this example, the column address that controls the column select signal CSL is captured on the leading edge of the external clock. The column address may be externally input or may be generated by a counter inside the DRAM by way of example. By a column address thus captured, a corresponding column address select signal CSL is selected. In the example of FIG. 4, CSL0 is activated in correspondence with the first address and CSL1 is selected in correspondence with the next address. By a CSL line being activated, a selected sense amplifier and the data line are connected together, so that data is transferred to the outside of the cell array.

As described above, in the columns, successive data input/output operations can be performed synchronously with the external clock. If the time that elapses from when the external clock rises to the time data is output is called the clock access time, then factors that affect the clock access time include various timing margins required with CSL and data lines. That is, the timing control for raising a CSL line, amplifying data on a data line, lowering the CSL line, equalizing the data line, and so on must be performed with margins sufficient to accommodate process variations. This may result in impossibility of increasing the clock frequency.

Thus, in the conventional DRAM, increasing the number of data bits involves increasing the number of cell arrays to be activated at the same time or increasing the number of data lines in the cell array control circuit. This will inevitably increase the power dissipation and chip area.

Moreover, when the data lines are multilayered, the pitch of the wiring lines on the top layer in particular will become stricter than conventional. Furthermore, in order to operate the columns at high speed with an external clock, it is required to control the timing of raising the CSL lines, amplifying data on the data lines, lowering the CSL lines, equalizing the data lines, and so on with margins sufficient to accommodate process variations. This is a cause of the prevention of high-speed operation.

SUMMARY OF THE INVENTION

It is an object of the invention to provide a semiconductor device which can realize a multi-bit memory cell without increasing the number of cell arrays to be activated simultaneously and with a minimum increase in the area of cell array control circuits.

It is the other object of the invention to provide a semiconductor device which is capable of operating at a high clock frequency with minimum control of the timing of raising CSL lines, amplifying data on data lines, lowering the CSL lines, and equalizing the data lines.

According to a first aspect of the invention there is provided a semiconductor device comprising: a memory cell array having memory cells arranged in a matrix form, a plurality of bit lines for communicating information to the memory cells, and a plurality of word lines crossing the bit lines to select among the memory cells; a plurality of sense amplifiers for amplifying data read out onto the bit lines; a plurality of data lines for transferring data amplified by the sense amplifiers to the outside of the cell array, the plurality of data lines including first and second wiring layers; a plurality of column select circuits for controlling connections of the plurality of data lines and the plurality of sense amplifiers; and a plurality of control signal lines connected to the plurality of column select circuits, the plurality of control lines including third and fourth wiring layers.

The semiconductor device may be arranged such that the data lines includes a first and second plurality of wiring layers, the first wiring layer is connected to the column select circuits, and the second wiring layer is connected to at least one of the first wiring layer, and the data lines include first and second wiring layers, a plurality of the third wiring layers are respectively connected to the column select circuit, and a plurality of the fourth wiring layers are respectively connected at least one the third wiring layer.

Alternatively, the semiconductor memory device may be arranged such that the data lines including the first wiring layers are connected to a respective one of the column select circuits, the data lines including the second wiring layers are connected to a respective one of the data lines including the first wiring layers, and the column select lines including the third wiring layers are connected to a respective one of the column select circuits, and the column select lines including the fourth wiring layers are connected to ones of the column select lines including the third wiring layers.

Preferred manners of the first aspect of the invention are as follows.

(1) The data lines and column select lines respectively including the first and third wiring layers are arranged in parallel with the word lines, and the data lines and column select lines respectively including the second and fourth wiring layers are arranged in parallel with the bit lines.

(2) Each of the column select circuits includes a MOS transistor having a gate, a source, and a drain, the gate being connected to one of the column select lines including the third wiring lines, one of the source and drain being connected to one of the sense amplifiers, and the other of the source and drain being connected to one of the data lines including the first wiring layers.

(3) Each of the column select lines including the third wiring lines is connected to at least two of the column select circuits.

(4) Each of the data lines including the first wiring lines is connected to at least two of the column select circuits which are connected to different ones of the column select circuit including the third wiring lines.

(5) The semiconductor memory device is a semiconductor memory device in which, in a state where the word line WL is selected and data from memory cells selected by the word line are latched by the sense amplifiers, data are successively read or written by controlling column select signals in synchronism with an externally applied signal, and wherein a currently selected control signal line and a control signal line to be selected next are selected so as to select a column select circuit that is connected to a data line different from a data line to which a currently selected column select circuit is connected.

(6) The first wiring layers and the second wiring layers are formed of a first material, and the second wiring layers and the fourth wiring layers are formed of a second material.

(7) The first wiring layer and the second wiring layer are formed of the same wiring layer, and the second wiring layer and the fourth wiring layer are formed of the same wiring layer.

(8) A first control circuit for controlling control signal lines of the column select circuits and a second control circuit for controlling the data lines, and wherein the first and second control circuits are placed adjacent to each other and part of signals controlling the second control circuit are generated by the first control circuit is further provided.

According to the first aspect of the invention, the control signal lines of the column select circuits are formed of first and second wiring layers and the data lines are formed of third and fourth wiring layers. By devising the arrangement and connection of the wiring layers, the number of cell arrays that are activated simultaneously can be decreased and an increase in the chip area can be checked to a minimum to increase the number of data bits.

According to the first aspect of the invention, a data line connected to a column select circuit selected by a column control signal line and a data line connected to a column select circuit selected simultaneously can form separate circuits. In addition, by adjusting the lengths of the control signal lines on the first wiring layer and the data lines on the third wiring layer, the number of data lines to take out data simultaneously can be adjusted easily without the need of making layout rules for the first and third wiring layers strict. As a result, the number of cell arrays that are activated simultaneously can be decreased and an increase in chip area can be checked to a minimum to increase the number of data bits.

According to a second aspect of the invention there is provided a semiconductor memory device comprising: a memory cell array having memory cells arranged in a matrix form, a plurality of bit lines for communicating information to the memory cells, and a plurality of word lines crossing the bit lines to select among the memory cells; a plurality of sense amplifiers for amplifying data read out onto the bit lines; a plurality of data lines for transferring data amplified by the sense amplifiers to the outside of the cell array; a plurality of column select circuits for controlling connections of the plurality of data lines and the plurality of sense amplifiers; and wherein the semiconductor memory device is a semiconductor memory device in which, in a state where the word line WL is selected and data from memory cells selected by the word line are latched by the sense amplifiers, data are successively read or written by controlling column select signals in synchronism with an externally applied signal, and wherein a currently selected control signal line and a control signal line to be selected next are selected so as to select a column select circuit that is connected to a data line different from a data line to which a currently selected column select circuit is connected.

According to the second aspect, by controlling the column select signal lines so that a column select signal line to be selected next will select a column select circuit that is connected to a data line different from a data line to which a currently selected column select circuit is connected, high-speed operation can be performed regardless of various timing margins. Thus, a dynamic semiconductor memory device can be implemented which operates at a high clock frequency.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS (Embodiment 1)

Figure 5:
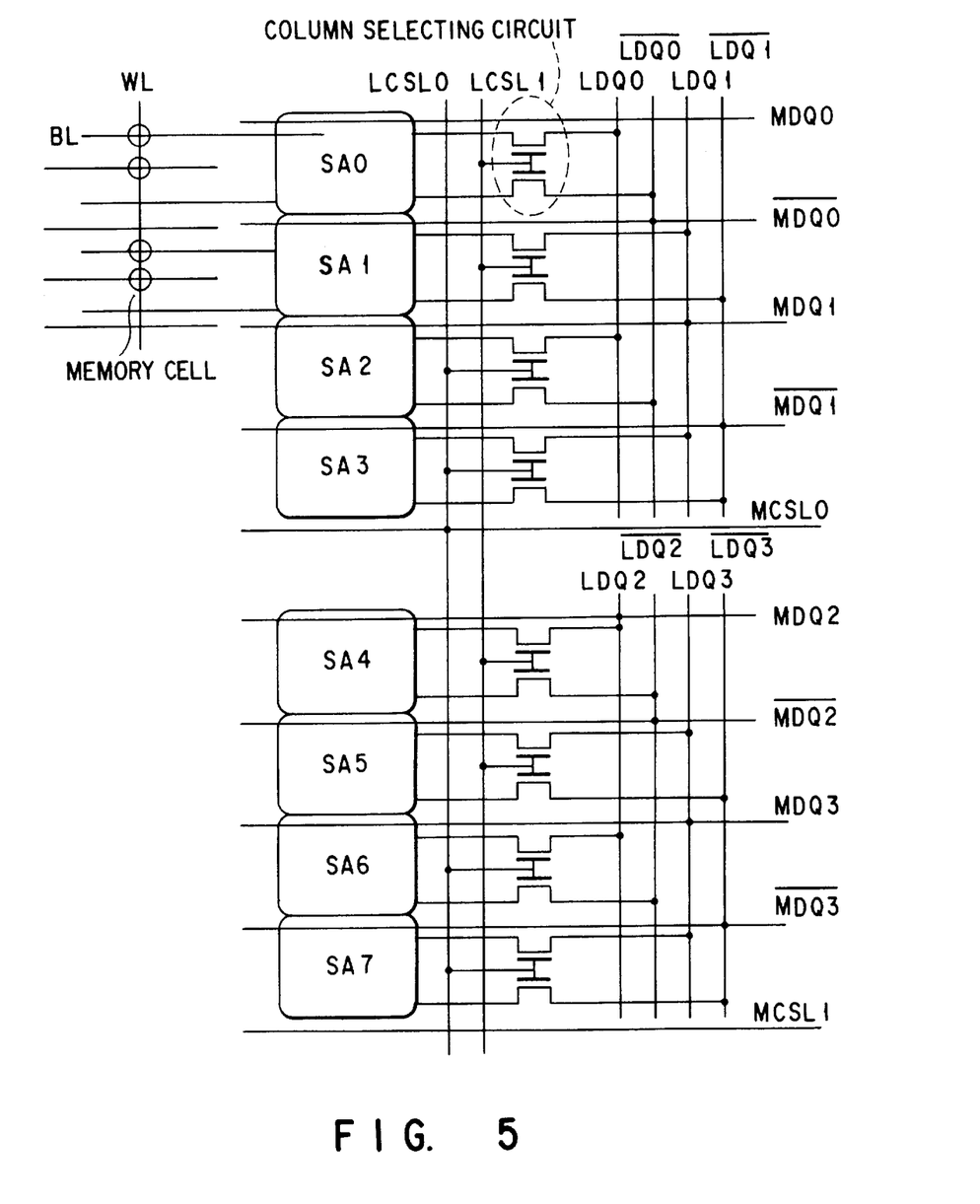
FIG. 5 shows an arrangement of the core circuit of a DRAM according to a first embodiment of the invention.

Referring now to FIG. 5 illustrating an arrangement of the core circuit of a DRAM according to a first embodiment of the invention, symbols SAi (i=0 to 7) indicate cell array control circuits, each of which is composed of a sense amplifier, bit line equalizer, and so on. Note that, in FIG. 5, column select circuits alone are indicated separated from the cell array control circuits in order to make the feature of the first embodiment easy to understand. In the following description, the cell array control circuit may be referred to as the sense amplifier.

In the present embodiment, one column select circuit is provided every four bit lines. One column select circuit is connected to two of the four bit lines (complementary bit line pair). In FIG. 5, the bit lines are indicated connected to the sense amplifier from the left side only. The sense amplifier (the so-called shared sense amplifier) may be shared among bit lines on both sides.

Local DQ lines (the third wiring layer) LDQ extends in the same direction as a word line WL in the cell array. In the present embodiment, the length of the word line is equal to the length of an array of four cell array control circuits SA.

A set of local DQ line pair (LDQ, /LDQ) is shared between two cell array control circuits SA. For example, the local DQ line pair LDQ0, /LDQ0 is shared between cell array control circuits SA0 and SA2 and the local line pair LDQ1, /LDQ1 is shared between the cell array control circuits SA1 and SA3. In order to select between two cell array control circuits SA that share a local DQ line pair, a local column select signal line (first wiring layer) LCSL is arranged in the same direction as the local DQ lines LDQ. The local CSL lines LCSL and the local DQ lines LDQ are formed of the same wiring layer.

In the present embodiment, when the local CSL line LCSL1 is activated, the cell array control circuits SA0, SA1, SA4 and SA5 are selected, so that data are output onto the local DQ lines LDQ0 to LDQ3. The local DQ lines LDQ0 to LDQ3 are respectively connected to main DQ lines MDQ0 to MDQ3, which are formed of a wiring layer (fourth wiring layer) different from that (third wiring layer) of the local DQ lines LDQ and arranged in the same direction as the bit lines BL.

The column select signal lines are multilayered as with the data lines. In the present embodiment, the local CSL lines LCSL0 and LCSL1 are respectively connected to main CSL lines MCSL0 and MCSL1 (second wiring layer) which are formed of the same wiring layer as the main DQ lines MDQ and arranged in the same direction as the bit lines BL.

In the present embodiment, when one column (for example, main CSL line MCSL0, local CSL line LCSL0) is selected by the column select circuit, four DQ line pairs of the main DQ lines MDQ0 and /MDQ0 to MDQ3 and /MDQ3 are allowed to transfer cell data to outside. By regarding the cell array control circuits SA0 to SA3 as one block, the local DQ lines LDQ and the main DQ lines MDQ can be increased freely in number. This allows a number of items of data to be handled at the same time without increasing the cell array area or the number of cell arrays to be activated simultaneously.

Thus, according to the present embodiment, each local CSL line LCSL is connected to more than one column select circuits, and each local DQ line pair LDQ is connected to more than one column select circuits each of which is connected to a separate local CSL line LCSL. Thus, column select circuits that are connected in common to a local CSL line LCSL will not be selected simultaneously. Moreover, when two or more column select circuits are selected by a local CSL line LCSL, data are output onto all the local DQ line pairs LDQ.

That is, a local DQ line LDQ connected to a column select circuit selected by a local CSL line LCSL and a local DQ line LDQ connected to a column select circuit selected simultaneously can form separate circuits. In addition, by adjusting the lengths of the local CSL lines LCSL and the local DQ lines LDQ, the number of data lines which take out data simultaneously can be adjusted easily without strict layout rules. As a result, the number of cell arrays that are activated simultaneously can be decreased and an increase in chip area can be suppressed to a minimum to realize a multi-bit.

(Embodiment 2)

Figure 6:
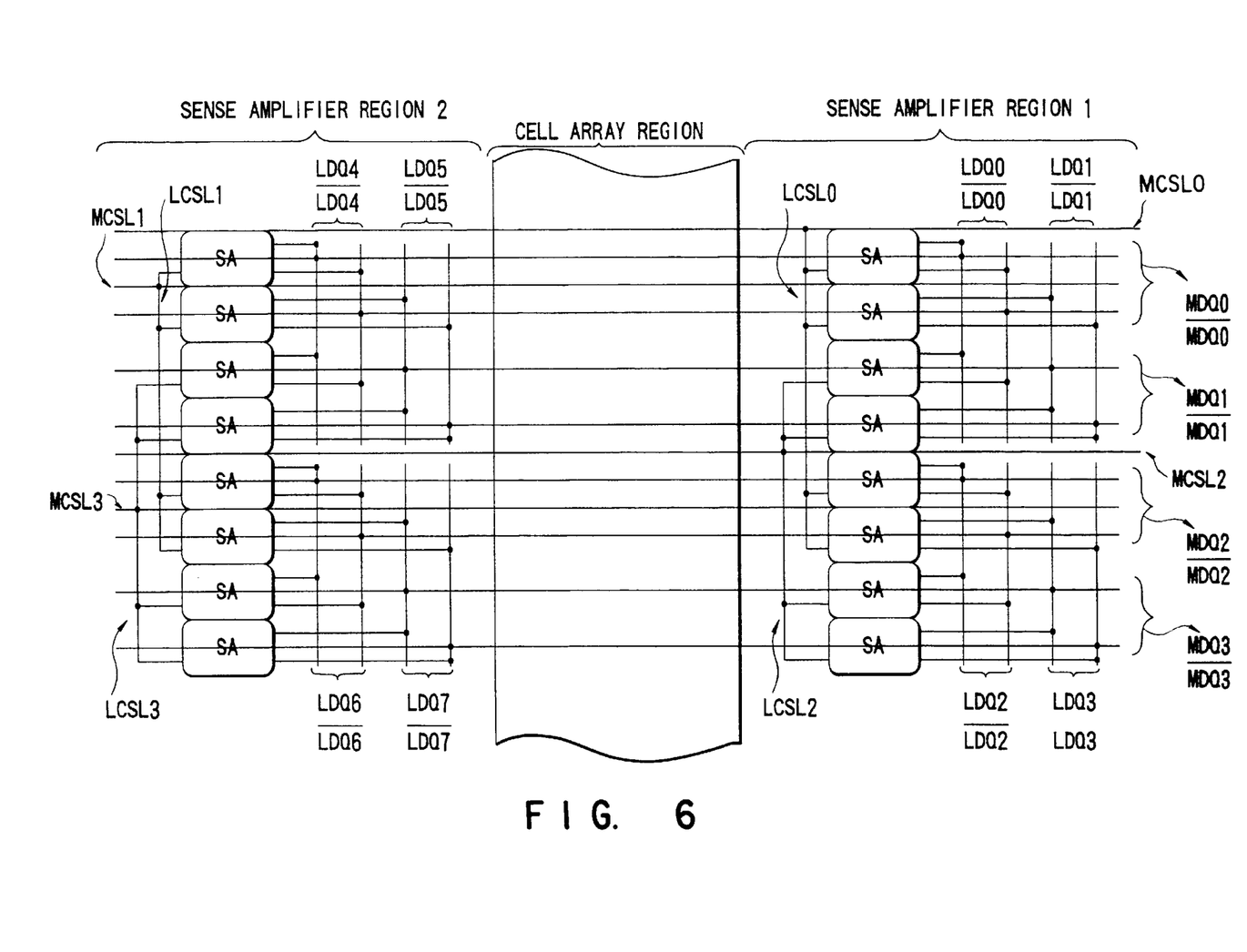
FIG. 6 shows an arrangement of the core circuit of a DRAM according to a second embodiment of the invention.

FIG. 6 shows an arrangement of a DRAM according to a second embodiment of the invention in which the sense amplifier area is divided into a plurality of subareas. Local CSL lines LCSL0 to LCSL3 and local DQ line pairs LDQ0, /LDQ0 to LDQ7, /LDQ7 are provided for the sense amplifier subareas 1 and 2. The local CSL lines LCSL0, LCSL1, LCSL2 and LCSL3 are connected to main CSL lines MCSL0, MCSL1, MCSL2 and MCSL3, respectively.

Unlike a general relationship between local and main CSL lines, the local CSL lines have a one-to-one relationship with the main CSL lines. This is because the main and local CSL lines are formed of different wiring layers.

Local DQ line pairs LDQ0, /LDQ0 to LDQ7, /LDQ7 are connected to main DQ line pairs MDQ0, /MDQ0 to MDQ3, /MDQ3 in a many-to-one relationship. For example, in the present embodiment, the main DQ line MDQ0 is connected to the local DQ lines LDQ0 and LDQ4 and the main DQ line MDQ1 is connected to the local DQ lines LDQ1 and LDQ5. When the local DQ line LDQ0 is connected to the main DQ line MDQ0 by the local CSL line LCSL0 at a high level, the local CSL line LCSL1 which is the control line for the local DQ line LDQ4 is at a low level. Thus, even if a main DQ line is connected to two or more local DQ lines, proper operation can be ensured.

In addition, an extension of the present embodiment to an arrangement in which the cell array area is divided into subareas is also easy. This is because the present embodiment is featured by:

(1) A main CSL line MCSL is connected to only one local CSL line LCSL.

(2) The main DQ line MDQ can be connected to two or more local DQ lines LDQ.

(3) The main CSL lines MCSL and the main DQ lines MDQ are arranged in the same direction as the bit lines BL, and the local CSL lines LCSL and the local DQ lines LDQ are arranged in the same direction as the word lines WL. These features will not prevent a DRAM array from being divided.

(Embodiment 3)

Figure 7:
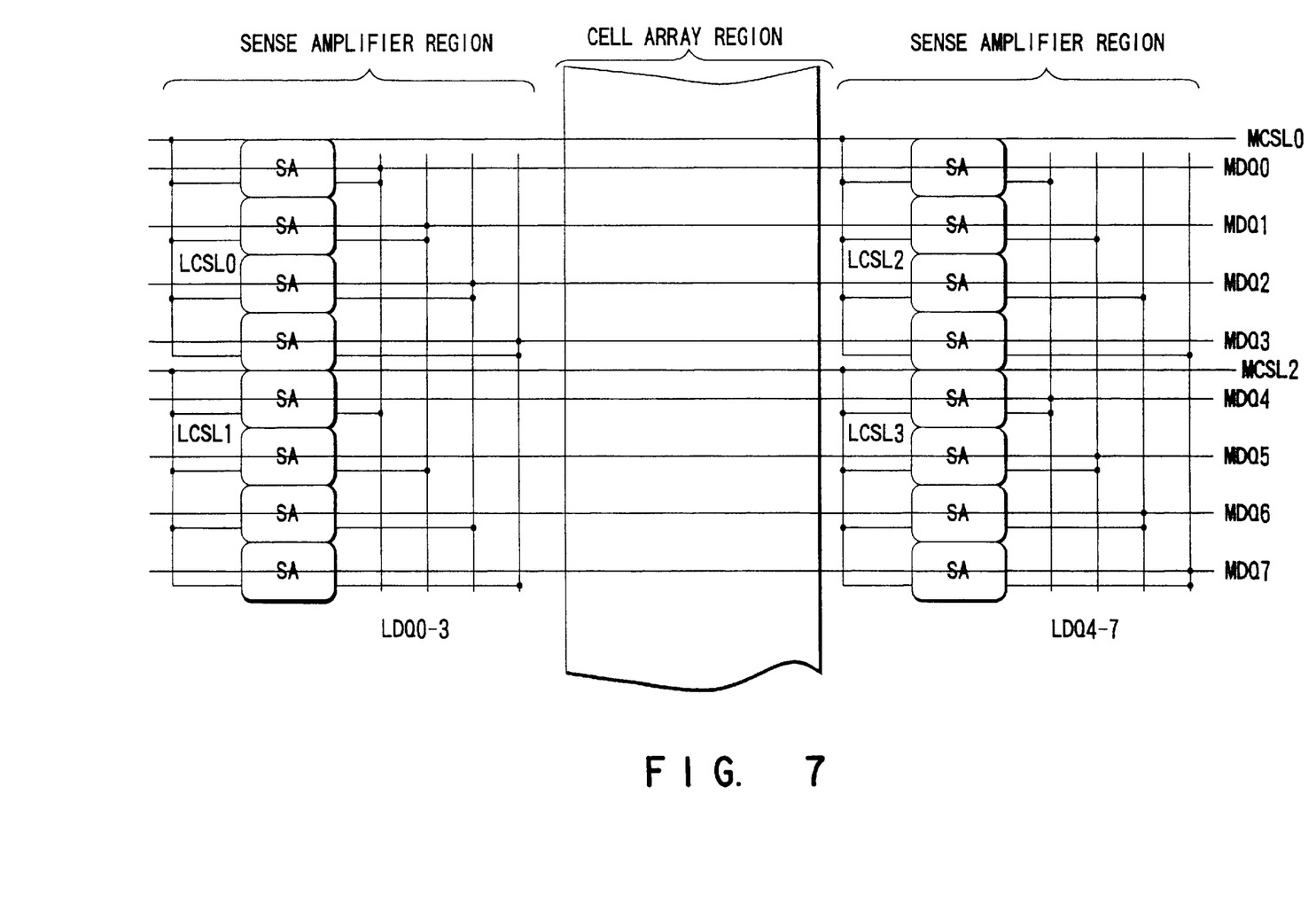
FIG. 7 shows an arrangement of the core circuit of a DRAM according to a third embodiment of the invention.

FIG. 7 shows an arrangement of a DRAM according to a third embodiment of the invention in which the sense amplifier area is divided into subareas. Note that each local DQ line pair (LDQ, /LDQ) is indicated by a single line for the purpose of simplifying illustration. In the present embodiment, two or more local CSL lines are connected to a main CSL line.

In the present embodiment, the local CSL lines LCSL0 and LCSL2 are connected to the main CSL line MCSL0, and the local CSL lines LCSL1 and LCSL3 are connected to the main CSL line MCSL1. A one-to-one correspondence exists between the local DQ line pairs LDQ and the main DQ line pairs MDQ. In the present embodiment, the local DQ line pairs LDQ0 to LDQ3 arranged in the sense amplifier area 1 are respectively connected to the main DQ line pairs MDQ0 to MDQ3. The local DQ line pairs LDQ4 to LDQ7 are connected to the main DQ line pairs MDQ4 to MDQ7. The features of the present embodiment include:

(1) A main CSL line MCSL can be connected to two or more local CSL lines LCSL.

(2) A main DQ line MDQ is connected to only one local DQ line LDQ.

(3) The main CSL lines MCSL and the main DQ lines MDQ are arranged in the same direction as the bit lines BL and the local CLS lines LCSL and the local DQ lines LDQ are arranged in the same direction as the word lines WL.

(Embodiment 4)

Figure 8:
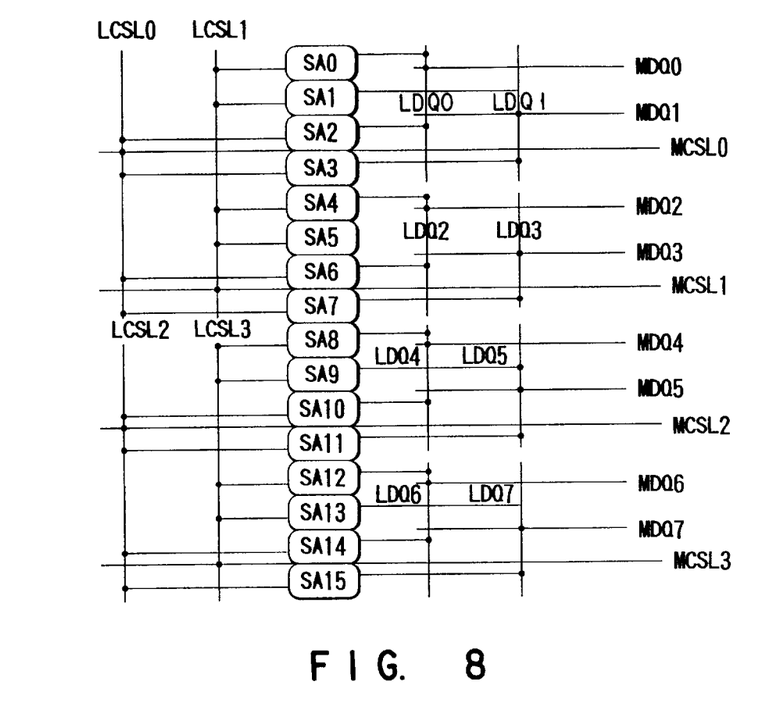
FIG. 8 shows an arrangement of the core circuit of a DRAM according to a fourth embodiment of the invention.

A fourth embodiment of the invention will be described next, which relates to an operation method which permits the DRAM having the core arrangement described in connection with the first and second embodiments of the invention to operate at high speed. FIG. 8 shows a core arrangement according to the fourth embodiment. This figure shows the core arrangement shown in FIG. 5 as the first embodiment in a larger region, so that four local CSL lines LCSL and eight local DQ line pairs LDQ are illustrated.

In the core arrangement of FIG. 8, when the main CSL line MCSL0 or MCSL1 is selected, only four main DQ line pairs MDQ0 to MDQ3 are actually used to transfer data. On the other hand, when the main CSL line MCSL2 or MCSL3 is selected, only four main DQ line pairs MDQ0 to MDQ3 are actually used to transfer data. That is, when a column select line is selected, DQ line pairs exist over which no data is transferred. Thus, with the core arrangement of FIG. 8, it is also possible to select two or more CSL lines.

Figure 9:
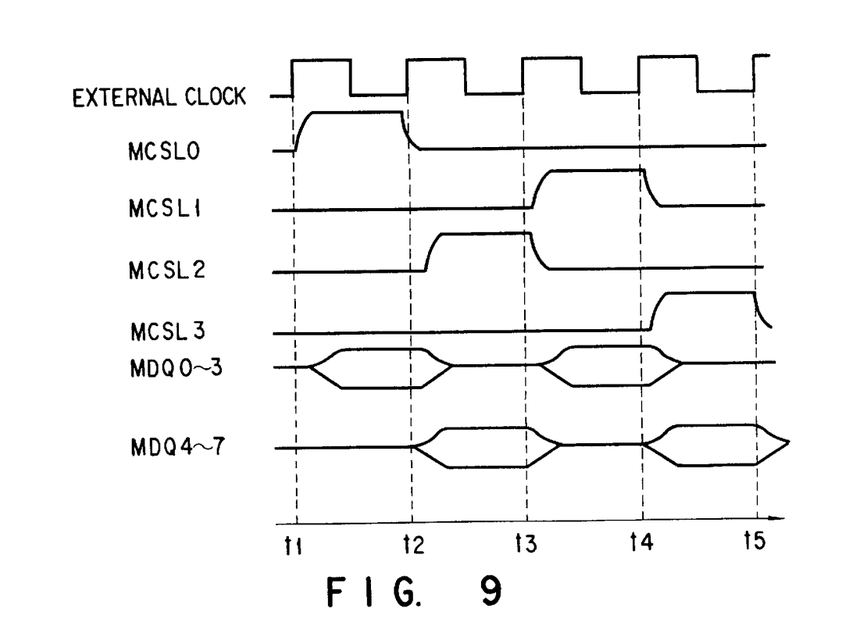
FIG. 9 is a timing chart for high-speed read operation of the DRAM of FIG. 8.

FIG. 9 is a timing chart when the core arrangement of FIG. 8 performs a high-speed read operation. This operation is performed such that, in a state where a word line WL is selected and data from memory cells selected by that word line are latched by sense amplifiers SA, data are successively read or written by controlling column select signals in synchronism with an externally applied signal. In FIG. 9, the main CSL line MCSL0 is selected first (t=t1), so that data are read out onto the main DQ line pairs MDQ0 to MDQ3. In the next cycle from time t=t2 to t=t3, the main CSL line MCSL2 that does not share DQ lines with the line MCSL0 is selected, so that data are read out onto the main DQ line pairs MDQ4 to MDQ7. During the interval from t=t2 to t=t3, the main CSL line MCSL0 is placed in nonselected state and the main DQ lines MDQ0 to MDQ3 are precharged to a preselected potential. During the third cycle, while the main CSL line MCSL1 is selected and data are read out onto the main DQ lines MDQ0 to MDQ3, the main CSL line MCSL2 that was selected in the previous cycle is returned to the nonselected state and the main DQ lines MDQ4 to MDQ7 are precharged.

Thus, according to the present embodiment, by alternately selecting the CSL lines that do not share DQ line pairs, the need for margins of the timing of raising the CSL lines, precharging the DQ line pairs and so on is eliminated, thereby high-speed operation can be performed.

(Embodiment 5)

Figure 10:
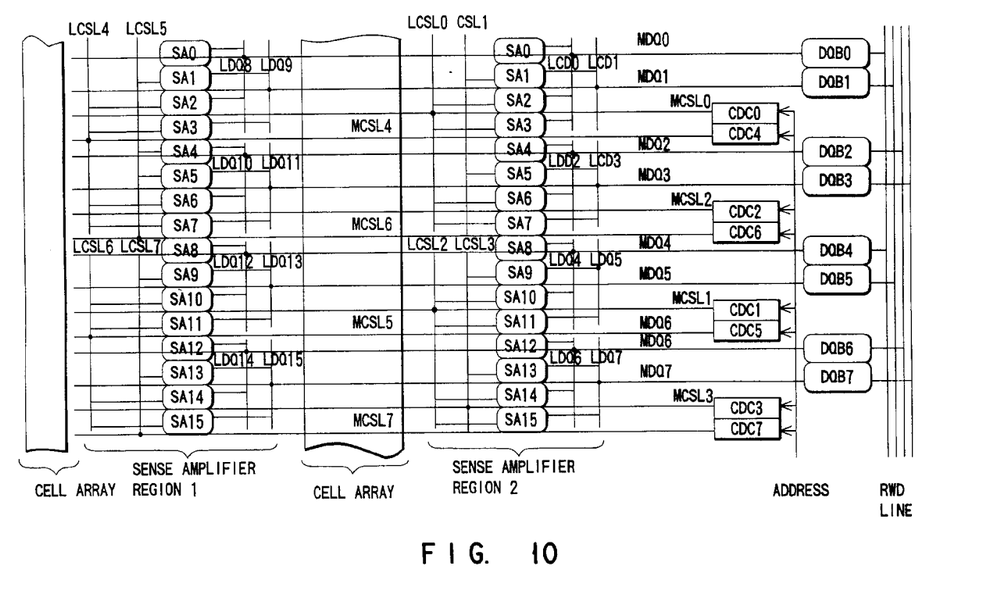
FIG. 10 shows an arrangement of the core circuit of a DRAM according to a fifth embodiment of the invention.

FIG. 10 is a schematic diagram of a cell array according to a fifth embodiment of the invention. In FIG. 10, the DRAM core arrangement shown in FIG. 8 is shown to cover a plurality of sense amplifier areas. Further, there are illustrated column decoders CDC for decoding the column control signal lines (main CSL lines MCSL and local CSL lines LCSL) and DQ buffers DQB for connecting the data line pairs MDQ to outside of the cell array.

Local DQ line pairs LDQ0 to LDQ15 and local CSL lines LCSL0 to LCSL7 are arranged on the sense amplifier areas 1 and 2. As global lines (line pairs) there are arranged main DQ lines MDQ0 to MDQ7 and main CSL lines MCSL0 to MCSL7, which are respectively connected to the DQ buffers DQB0 to DQB7 and the column decoders CDC0 to CDC7. The subscripts attached to the column decoders CDC represent the order in which they are activated as the column address is incremented at the time of high-speed operation of the column arrangement.

Although the description of the fourth embodiment may be partly repeated, in a state where the column decoders CDC0, CDC2, CDC4 and CDC6 are selected, data appear on the main DQ lines MDQ0 to MDQ3 and then transferred to external data line pairs RWD through the DQ buffers DQB0 to DQB3. On the other hand, when the column decoders CDC1, CDC3, CDC5 and CDC7 are selected, data appear on the main DQ lines MDQ4 to MDQ7 and then transferred to the external data line pairs RWD through the DQ buffers DQB4 to DQB7. For this reason, the same main DQ line MDQ is not continuously used for data transfer and each main DQ line MDQ onto which data is read out in a cycle is allowed in the next cycle to make preparations for the next operation, such as precharging. In the present embodiment, the corresponding DQ buffers, for example, DQB0 and DQB4, may be replaced with a common buffer.

(Embodiment 6)

As a sixth embodiment of the invention, control of the DQ buffers in the core arrangement described in connection with the fifth embodiment will be described. In general, a decision as to whether a DQ buffer is to be operated is made based on the column address. Strictly speaking, the DQ buffers will therefore need to have means for decoding the column address. In the layout as shown in FIG. 10, however, each of the column decoders CDC with means for decoding the column address is placed near to a respective corresponding one of the DQ buffers, which allows the corresponding DQ buffer and column decoder to share means for decoding the column address. It is necessary only that, in the example of FIG. 10, the DQ buffers DQB0 to DQB3 be activated only when the column decoders CDC0, CDC2, CDC4 and CDC6 are selected, while the DQ buffers DQB4 to DQB7 be activated only when the column decoders CDC1, CDC3, CDC5 and CDC7 are selected.

Figure 11:
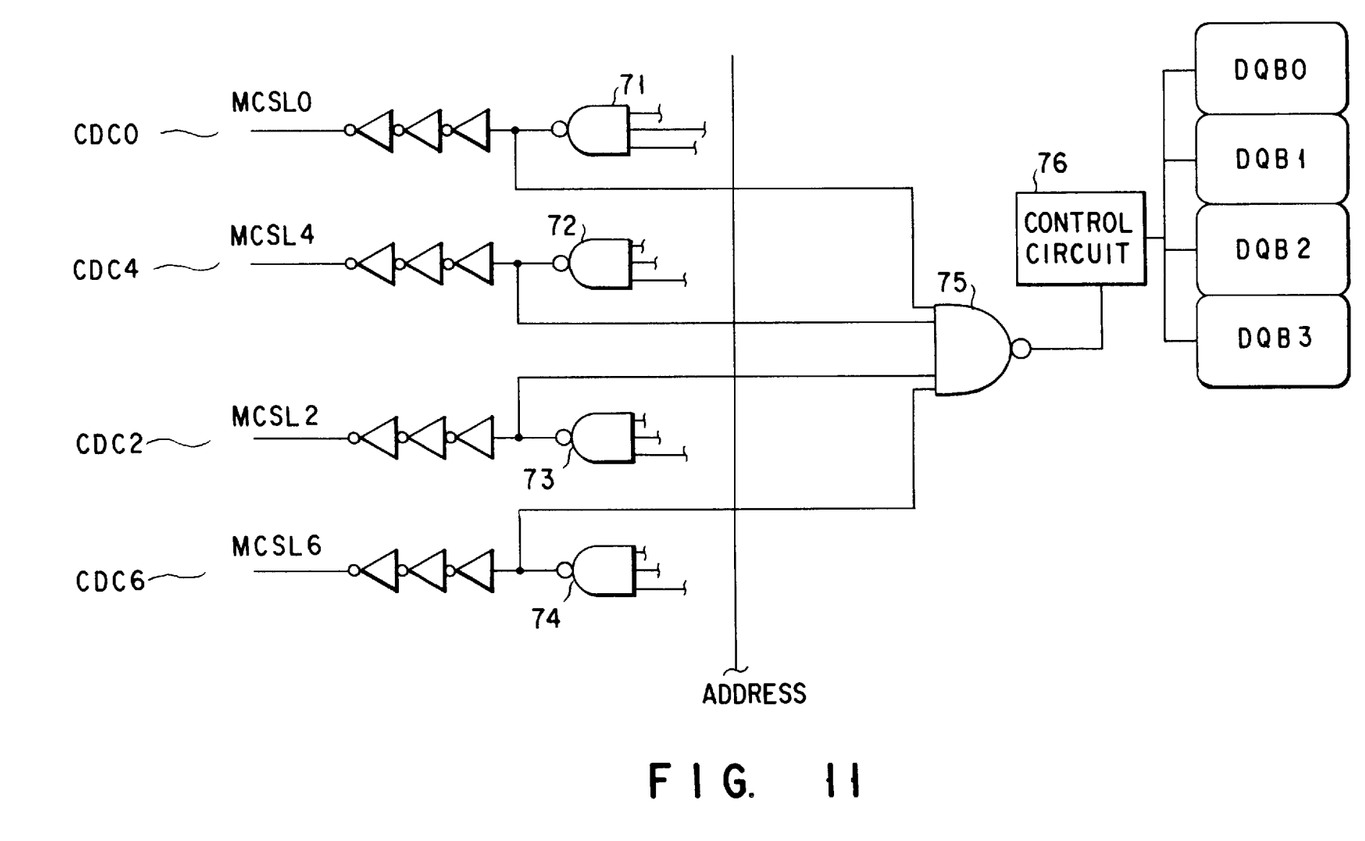
FIG. 11 shows an arrangement of the column core circuit of a DRAM according to a sixth embodiment of the invention.

In FIG. 11 there is illustrated in block diagram form an arrangement for controlling the DQ buffers by means of the column decoders. The output of each of NAND circuits 71 to 74 included in the respective column decoders CDC0, CDC2, CDC4 and CDC6 each of which selects a corresponding column select line CSL is coupled to a NAND circuit 75, the output of which is coupled to a control circuit 76 for generating control signals to control the DQ buffers.

In the present embodiment, when none of the column decoders CDC0, CDC2, CDC4 and CDC6 is selected, the output of the NAND circuit 75 is at a low level. When some one of the column decoders is selected, the output of the NAND circuit 75 goes high. The present embodiment can thus be adapted to the operation as described in connection with the fifth embodiment. In addition, the need to control the DQ buffers from the outside of the core arrangement is eliminated, which allows the number of control circuits and the chip area to be reduced.

(Embodiment 7)

As described above, one of the features of the invention is that, in a region defined by arranging the column select lines (CSL lines) and the data line pairs (DQ line pairs), a plurality of sense amplifier areas arranged in that region do not share both the CSL lines and the DQ line pairs. Therefore, the number of the CSL lines or DQ lines to the predetermined area increases in comparison with the case where those lines are shared. As a result, there arises a problem that design rules for wiring layers to form those lines becomes strict. Such a problem can be circumvented to some extent by making the local DQ lines or local CSL lines longer. However, if the number of divisions of the cell array further increases as the integration density of memories increases, then the number of the CSL lines or the DQ lines to the predetermined area will increase.

Figure 12:
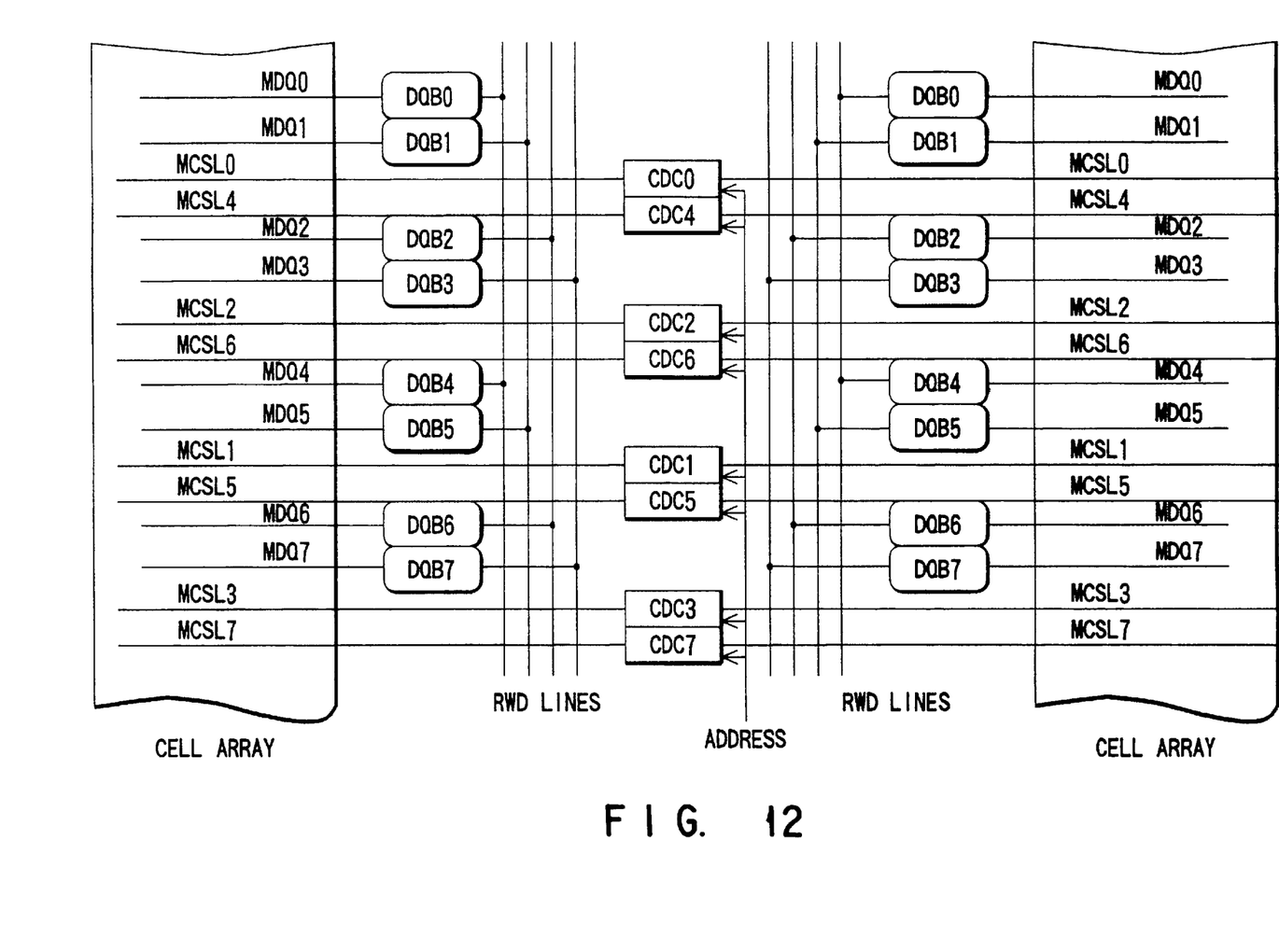
FIG. 12 shows an arrangement of the core circuit of a DRAM according to a seventh embodiment of the invention.

A seventh embodiment of the invention arranged to circumvent such a problem is illustrated in FIG. 12, which shows an arrangement in which column decoders, which are conventionally placed outside a region defined by arranging CSL lines and DQ line pairs, are placed in the center of that region. By so doing, even with the region divided into eight cell array areas, wiring rules which are substantially the same as those when the region is divided into four can be implemented and as such a substantial relaxation of design rules can be expected.

The present invention is not restricted to the preferred embodiments described above. The memory cell array may comprise one-transistor/one-capacitor memory cells or memory cell units each with a plurality of such memory cells connected in series. Moreover, the present invention may be applied to a clock-locked DRAM (synchronous DRAM). Furthermore, the memory may be an EEPROM using non-volatile memory cells.

The present invention may be practiced or embodied in still other ways without departing the scope and spirit thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a memory cell array having memory cells arranged in a matrix form;

a plurality of bit lines which communicate information to said memory cells;

a plurality of word lines crossing said plurality of bit lines to select among said memory cells;

first to fourth sense amplifiers which amplify data read out onto said bit lines;

first and second main data line pairs which transfer data amplified by said sense amplifiers to the outside of said cell array;

first and second local data line pairs coupled to said first and second main data line, respectively;

first to fourth column selecting circuits, wherein said first column selecting circuit is arranged between said first sense amplifier and said first local data line, said second column selecting circuit is arranged between said second sense amplifier and said second local data line, said third column selecting circuit is arranged between said third sense amplifier and said first local data line, and said fourth column selecting circuit is arranged between said fourth sense amplifier and said second local data line;

first and second local control signal lines connected to said first to fourth column selecting circuits; and first and second main control signal lines coupled to said first and second local control signal lines, respectively, wherein said first and second column selecting circuits connect said third and fourth sense amplifiers to said first and second local data line pairs, respectively, according to an activation signal on said second local signal line, said third and fourth column selecting circuits connect said first and second sense amplifiers to said first and second local data line pairs, respectively, according to an activation signal on said first local signal line, said first and second local control signal lines are parallel to each other and to said word lines, said first and second local data line pairs are parallel to each other and to said word lines, said first and second main data line pairs are parallel to each other and perpendicular to said word lines, said first and second main control signal lines are parallel to each other and perpendicular to said word lines, said local control signal lines and said local data line pairs are formed in a first layer, and said main data line pairs and said main control signal lines are formed in a second layer.

2. The semiconductor memory device according to claim 1, wherein a state exists, in which, when said word lines are selected and data from memory cells selected by said word lines are latched by said sense amplifiers, data is successively read or written by controlling column select signals in synchronism with an externally applied signal, and wherein a currently selected control signal line and a control signal line to be selected next are selected so as to select a column selecting circuit that is connected to a data line different from a data line to which a currently selected column selecting circuit is connected.

3. The semiconductor memory device according to claim 1, wherein said first layer is formed of a first material and said second layer is formed of a second material.

4. The semiconductor memory device according to claim 1, further comprising:

a first control circuit which controls said plurality of control signal lines of said column selecting circuits; and a second control circuit which controls said plurality of data lines, wherein said first and second control circuits are placed adjacent to each other, and part of signals controlling said second control circuit are generated by said first control circuit.

5. The semiconductor memory device according to claim 1, wherein each of said first to fourth column selecting circuits includes a MOS transistor having a gate, a source, and a drain, said gate being connected to said first layer, one of said source and drain being connected to one of said first to fourth sense amplifiers, and the other of said source and drain being connected to said first layer.

6. The semiconductor memory device according to claim 5, wherein a state exists, in which, when said word line is selected and data from memory cells selected by said word line are latched by said sense amplifiers, data is successively read or written by controlling column select signals in synchronism with an externally applied signal, and wherein a currently selected control signal line and a control signal line to be selected next are selected so as to select a column selecting circuit that is connected to a data line different from a data line to which a currently selected column selecting circuit is connected.

7. The semiconductor memory device according to claim 1, wherein said first layer is connected to at least two of said column selecting circuits.

8. A semiconductor device comprising:

a memory cell array having memory cells arranged in a matrix form;

a plurality of bit lines which communicate information to said memory cells;

a plurality of word lines crossing said plurality of bit lines to select among said memory cells;

first to eighth sense amplifiers which amplify data read out onto said bit lines;

first to fourth main data line pairs which transfer data amplified by said sense amplifiers to the outside of said cell array;

first to fourth local data line pairs coupled to said first to fourth main data line, respectively;

first to eighth column selecting circuits, wherein said first column selecting circuit is arranged between said first sense amplifier and said first local data line, said second column selecting circuit is arranged between said second sense amplifier and said second local data line, said third column selecting circuit is arranged between said third sense amplifier and said first local data line, said fourth column selecting circuit is arranged between said fourth sense amplifier and said second local data line, said fifth column selecting circuit is arranged between said fifth sense amplifier and said third local data line, said sixth column selecting circuit is arranged between said sixth sense amplifier and said fourth local data line, said seventh column selecting circuit is arranged between said seventh sense amplifier and said third local data line, and said eighth column selecting circuit is arranged between said eighth sense amplifier and said fourth local data line;

first and second local control signal lines connected to said first to fourth column selecting circuits; and first and second main control signal lines coupled to said first and second local control signal lines, respectively, wherein said first, second, fifth and sixth column selecting circuits connect said first, second, fifth and sixth sense amplifiers to said first to fourth local data line pairs, respectively, according to an activation signal on said second local signal line, said third, fourth, seventh and eighth column selecting circuits connect said third, fourth, seventh and eighth sense amplifiers to said first to fourth local data line pairs, respectively, according to an activation signal on said first local signal line, said first and second local control signal lines are parallel to each other and to said word lines, said first to fourth local data line pairs are parallel to each other and to said word lines, said first to fourth main data line pairs are parallel to each other and perpendicular to said word lines, said first and second main control signal lines are parallel to each other and perpendicular to said word lines, said first and second local control signal lines and said first to fourth local data line pairs are formed in a first layer, and said first and second main data line pairs and said first and second main control signal lines are formed in a second layer.

9. The semiconductor memory device according to claim 8, wherein a state exists, in which, when said word lines are selected and data from memory cells selected by said word lines are latched by said sense amplifiers, data is successively read or written by controlling column select signals in synchronism with an externally applied signal, and wherein a currently selected control signal line and a control signal line to be selected next are selected so as to select a column selecting circuit that is connected to a data line different from a data line to which a currently selected column selecting circuit is connected.

10. The semiconductor memory device according to claim 8, wherein said first layer is formed of a first material and said second layer is formed of a second material.

11. The semiconductor memory device according to claim 8, further comprising:

a first control circuit which controls said plurality of control signal lines of said column selecting circuits; and a second control circuit for controlling said plurality of data lines, wherein said first and second control circuits are placed adjacent to each other and part of signals controlling said second control circuit are generated by said first control circuit.

12. The semiconductor memory device according to claim 8, wherein each of said first to eighth column selecting circuits includes a MOS transistor having a gate, a source, and a drain, said gate being connected to said first layer, one of said source and drain being connected to one of said first to fourth sense amplifiers, and the other of said source and drain being connected to said first layer.

13. The semiconductor memory device according to claim 8, wherein said first layer is connected to at least four of said column selecting circuits.

14. The semiconductor memory device according to claim 8, wherein a state exists, in which, when said word line is selected and data from memory cells selected by said word line are latched by said sense amplifiers, data is successively read or written by controlling column select signals in synchronism with an externally applied signal, and wherein a currently selected control signal line and a control signal line to be selected next are selected so as to select a column selecting circuit that is connected to a data line different from a data line to which a currently selected column selecting circuit is connected.

15. The semiconductor memory device according to claim 8, wherein said first layer is connected to at least two of said column selecting circuits.

16. A semiconductor device comprising:

a memory cell array having memory cells arranged in a matrix form;

a plurality of bit lines which communicate information to said memory cells;

a plurality of word lines crossing said plurality of bit lines to select among said memory cells;

at least two sense amplifiers which amplify data read out onto said bit lines;

at least two main data line pairs which transfer data amplified by said sense amplifiers to the outside of said cell array;

at least two local data line pairs coupled to said main data line pairs, respectively;

at least two local control signal lines coupled to said sense amplifiers; and a main control signal line coupled to said at least two local control signal lines, wherein said local control signal lines are parallel to each other and perpendicular to said word lines, said local data line pairs are parallel to each other and to said word lines, said main data line pairs are parallel to each other and perpendicular to said word lines, said main control signal line is perpendicular to said word lines, said local control signal lines and said local data line pairs are formed in a first layer, and said main data line pairs and said main control signal lines are formed in a second layer.

17. The semiconductor memory device according to claim 16, wherein a state exists, in which, when said word lines are selected and data from memory cells selected by said word lines are latched by said sense amplifiers, data is successively read or written by controlling column select signals in synchronism with an externally applied signal, and wherein a currently selected control signal line and a control signal line to be selected next are selected so as to select a column selecting circuit that is connected to a data line different from a data line to which a currently selected column selecting circuit is connected.

18. The semiconductor memory device according to claim 16, wherein said first layer is formed of a first material and said second layer is formed of a second material.

19. The semiconductor memory device according to claim 16, further comprising:

a first control circuit which controls said plurality of control signal lines of said column selecting circuits; and a second control circuit for controlling said plurality of data lines, wherein said first and second control circuits are placed adjacent to each other and part of signals controlling said second control circuit are generated by said first control circuit.

20. The semiconductor memory device according to claim 16, wherein a state exists, in which, when said word line is selected and data from memory cells selected by said word line are latched by said sense amplifiers, data is successively read or written by controlling column select signals in synchronism with an externally applied signal, and wherein a currently selected control signal line and a control signal line to be selected next are selected so as to select a column selecting circuit that is connected to a data line different from a data line to which a currently selected column selecting circuit is connected.

* * * * *